United States Patent [19]
Lee

[11] Patent Number: 5,949,103
[45] Date of Patent: Sep. 7, 1999

[54] MOSFET WITH TUNNELING INSULATION AND FABRICATION METHOD THEREOF

[75] Inventor: Sang Hyun Lee, Choongcheongbuk-Do, Rep. of Korea

[73] Assignee: LG Semicon Co., Ltd., Cheongju, Rep. of Korea

[21] Appl. No.: 08/927,179

[22] Filed: Sep. 11, 1997

[30] Foreign Application Priority Data

Sep. 13, 1996 [KR] Rep. of Korea ............... 96/39656

[51] Int. Cl.$^6$ ................................................. H01L 29/72
[52] U.S. Cl. .................. 257/321; 257/322; 257/335; 257/401; 438/194; 438/263; 438/264
[58] Field of Search .................................. 257/321, 322, 257/335, 401; 438/194, 263, 264

[56] References Cited

U.S. PATENT DOCUMENTS 5,747,847  5/1998  Morinaka et al. .................. 257/321

Primary Examiner—Edward Wojciechowicz
Attorney, Agent, or Firm—Fleshner & Kim

[57] ABSTRACT

A tunneling insulation film MOSFET and a fabrication method for a tunneling insulation film MOSFET avoid a short channel effect and prevent a punchthrough phenomenon by forming a tunneling insulation film between a channel area and one of source area and a drain area. The fabrication method can include the steps of forming a gate oxide film and a gate electrode on a silicon substrate, forming a hole perpendicular to the surface of the silicon substrate along one side of the gate electrode, forming a tunneling oxide film in the hole, and forming a source and a drain by implanting an impurity into the silicon substrate using the gate electrode as a mask.

31 Claims, 10 Drawing Sheets

MOSFET WITH TUNNELING INSULATION AND FABRICATION METHOD THEREOF

BACKGROUND OF THE INVENTION

1. Field of the Invention

The present invention relates to a semiconductor memory device, and more particularly, to a metal oxide semiconductor electric field effect transistor (hereafter, called a MOSFET) forming a tunneling insulation between a channel region and one of a source region and a drain region.

2. Background of the Related Art

As shown in FIG. 1, a related art MOSFET includes a gate electrode 15 for applying a voltage for inducing an electric field effect in a semiconductor substrate 11, a gate oxide film 14 formed between the semiconductor substrate 11 and the gate electrode 15, a source region 12 for supplying a charge, a drain region 13 for drawing out a charge, and a channel region 11' formed between the source 12 and the drain 13.

As shown in FIG. 2A, in fabricating the MOSFET, a gate oxide film 14a and a polycrystalline polysilicon film 15a for forming a gate electrode are sequentially formed on the semiconductor substrate 11. Then, as shown in FIG. 2B, the gate electrode 15 is formed by patterning the polysilicon film 15a. As shown in FIG. 2C, a buffer oxide film 16 is formed on the entire resultant structure. Then, using the gate electrode 15 as a mask, an impurity is implanted into the semiconductor substrate 11 at both sides of the gate electrode 15 to respectively form the source region 12 and the drain region 13 and remove the buffer oxide film 16.

In the related art MOSFET fabricated according to the above-described method, an n-type impurity is implanted into a p-type semiconductor substrate to form the source and drain regions for an n-channel MOSFET. Similarly, a p-type impurity is implanted into an n-type semiconductor substrate to form the source and drain regions for a p-channel MOSFET.

When a fixed voltage is applied to the gate electrode 15, an n-type inversion layer 11' is induced in the semiconductor substrate 11. As a result, the source 12 and the drain 13 are electrically connected by the inversion layer 11'. Hereafter, the n-type inversion layer 11' electrically connecting the source 12 and the drain 13 is called an induced channel region 11'. When the channel region 11' is induced and a voltage is applied to the drain 13, electrons move freely the channel region 11' moves freely and consequently, a current flows between the source 12 and the drain 13.

With the increasing integration of semiconductor memory devices, the size of the MOSFET is accordingly being reduced and the length of the channel is shortened. Therefore, a threshold voltage Vth reduction problem becomes serious because of a short channel effect, and a leakage current flows between the source 12 and the drain 13 when no voltage is applied to the gate electrode 15. The leakage current degrades an operational characteristic of the transistor and generates a punchthrough phenomenon where the transistor cannot be controlled by a voltage applied to the gate electrode 15.

SUMMARY OF THE INVENTION

An object of the present invention is to solve at least the above-described problems and/or disadvantages of the related art.

Another object of the present invention to provide a tunneling insulation film transistor and a fabrication method thereof that prevents a short channel effect.

A further object of the invention is to provide a tunneling insulation film transistor and fabrication method thereof that prevents a punchthrough phenomenon by forming a tunneling insulation film between a channel region and a drain region.

To achieve at least the above objects and/or advantages in whole or in part, there is provided a tunneling insulation film MOSFET according to the present invention in which a gate oxide film and a gate electrode are sequentially formed on a semiconductor substrate, a source region and a drain region are formed in the semiconductor substrate at the sides of the gate electrode, a channel is formed between the source region and the drain region, and a tunneling insulation film is formed on a portion of the boundary surface of the semiconductor substrate and the drain.

The objects of the present invention can further be achieved in whole or in part using a fabrication method for a tunneling insulation film MOSFET that includes forming a gate electrode over an upper surface of a semiconductor substrate; forming a tunneling insulation film in the substrate adjacent a first side of the gate electrode; and forming impurity regions in the semiconductor substrate adjacent the tunneling insulation film and an opposite side of the gate electrode.

The objects of the present invention can further be achieved in whole or in part using a fabrication method for a MOSFET that includes forming a gate insulating film and a gate electrode on an upper surface of a semiconductor substrate; etching the semiconductor substrate at both sides of the gate electrode down to a predetermined depth; forming an oxide film on the entire surface of the semiconductor substrate; and removing the oxide film such that one side and a predetermined upper surface of the gate electrode and a portion of the etched surface of the semiconductor substrate extending from the one side of the gate electrode remain.

The objects of the present invention can further be achieved by a semiconductor device according to the present invention that includes a semiconductor substrate; a conductive layer formed over the semiconductor substrate; and a tunneling insulation film formed in the substrate adjacent to a first side of the conductive layer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
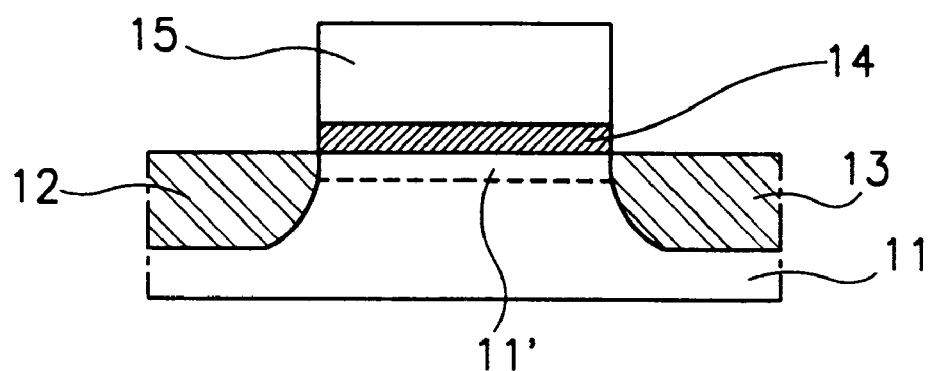
FIG. 1 is a diagram showing a longitudinal cross-sectional view of a related art MOSFET.
Figure 2A:
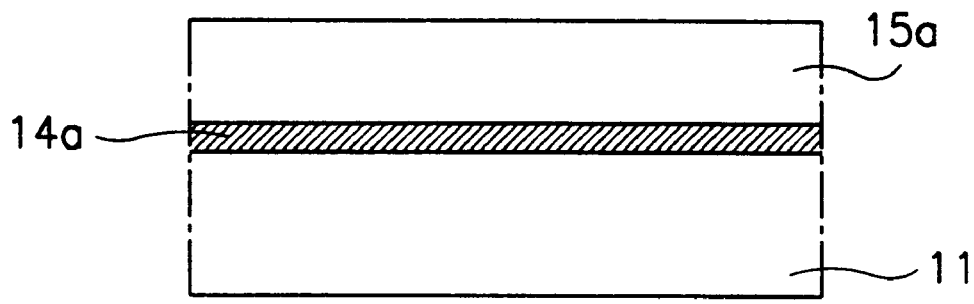
FIGS. 2A–2D are diagrams showing cross-sectional views of a fabrication method of the MOSFET of FIG. 1.
Figure 2B:
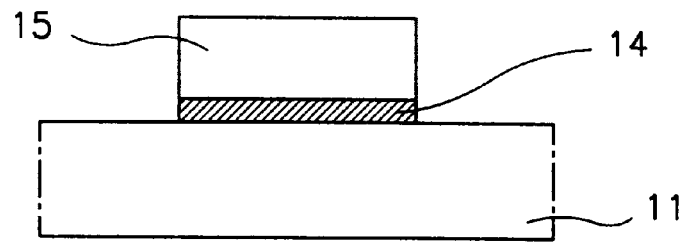
Figure 2C:
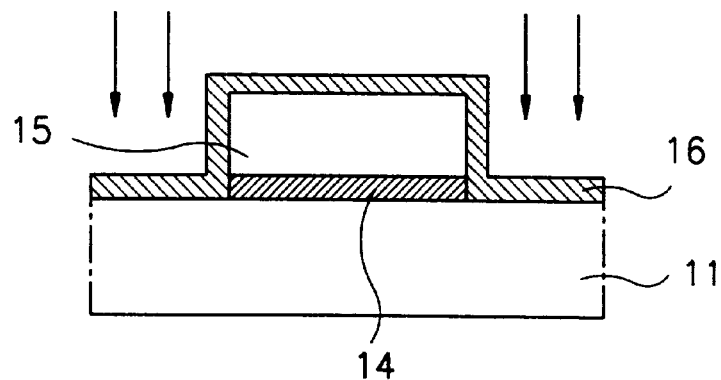
Figure 2D:
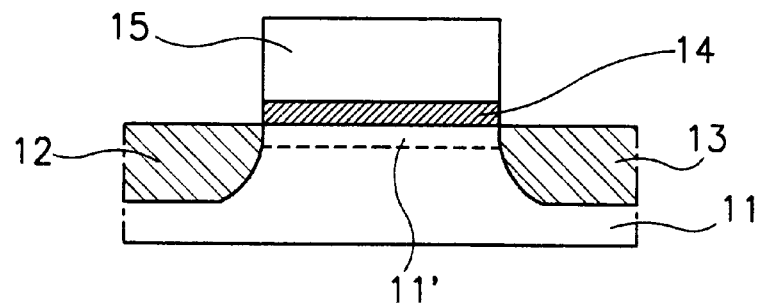
Figure 3:
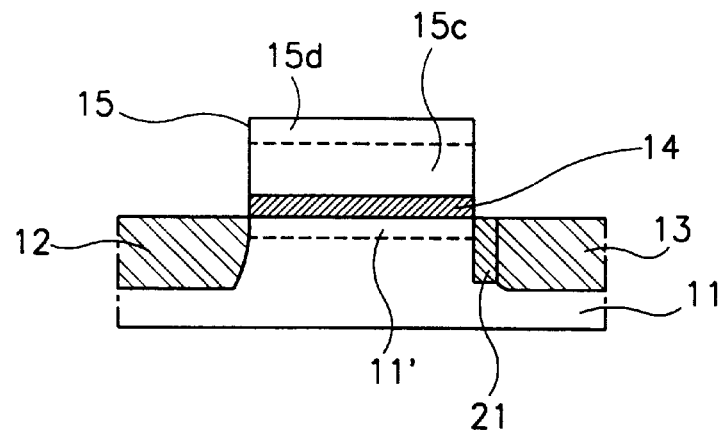
FIG. 3 is a diagram showing a cross-sectional view of a preferred embodiment of a tunneling insulation film MOSFET according to the present invention.

FIG. 3 is a cross-sectional view of a tunneling insulation film MOSFET according to a first preferred embodiment of the present invention. As shown in FIG. 3, a gate oxide film 14 and a gate electrode 15 are sequentially formed on a semiconductor substrate 11. The gate electrode 15 is preferably a double layer of a polysilicon layer 15c and a silicide 15d. A source 12 and a drain 13 are formed in regions of the semiconductor substrate 11 at respective sides of the gate electrode 15, and between the source and the drain 13, a channel region 11' is formed to electrically couple the source 12 and the drain 13.

A tunneling oxide film 21 is formed to a predetermined depth in the semiconductor substrate 11 relative to a top surface of the semiconductor substrate 11. The tunneling oxide film 21 is formed extendingly from one side of the gate electrode 15 toward the drain 13 and perpendicular to the channel region 11'. The tunneling oxide film 21 has an energy barrier determined by its thickness, and is preferably formed thinner than the gate oxide film 14 so that its energy barrier is smaller than the gate oxide film 14. When a turn-on voltage is applied to the gate, if the energy barrier of the tunneling oxide film 21 is higher than the gate oxide film 14, current flow is inhibited because of the barrier caused by the tunneling insulation film 21 formed between the source 12 and the drain 13. Thus, normal operation of the MOSFET device can be inappropriately prevented when the tunneling oxide film 21 is too thick.

A first preferred embodiment of a process for fabricating the first preferred embodiment of the tunneling insulation film MOSFET will now be described.

Figure 4A:
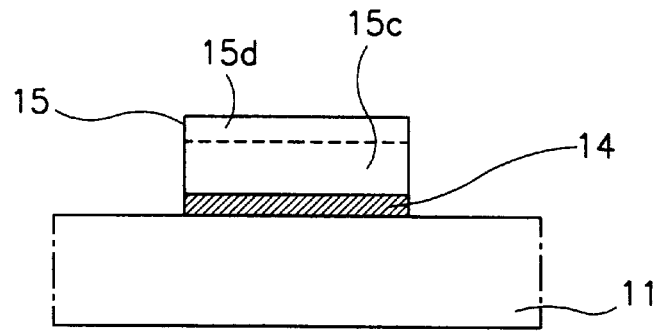
FIGS. 4A–4H are diagrams showing cross-sectional views of a preferred embodiment of a fabrication method of the MOSFET of FIG. 3.
Figure 4B:
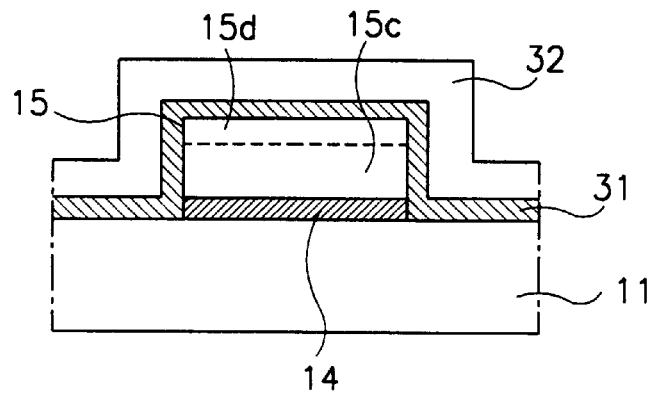
Figure 4C:
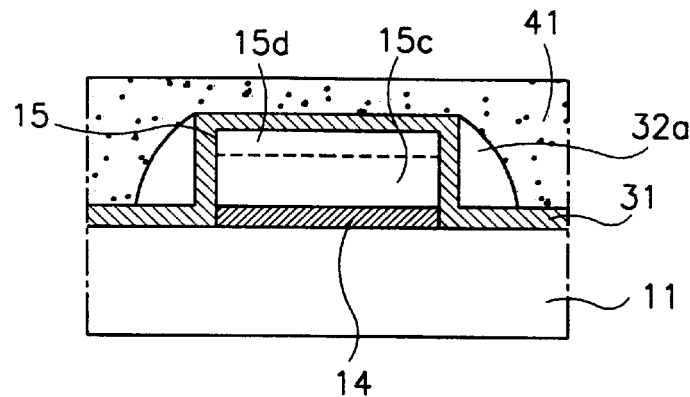
Figure 4D:
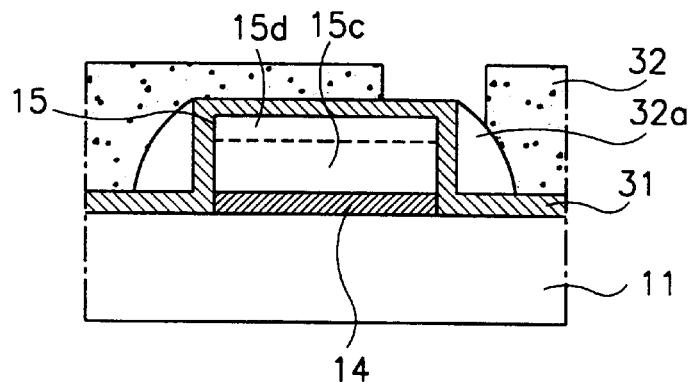
Figure 4E:
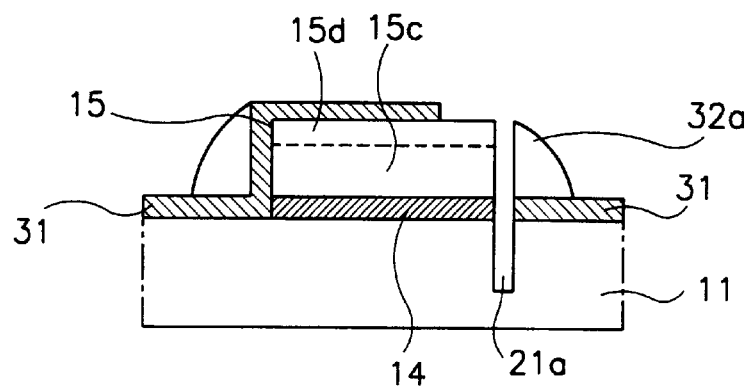

First, as shown in FIG. 4A, the gate oxide film 14 is formed on a p-type silicon substrate 11, and the polysilicon layer 15c and the silicide layer 15d are sequentially formed to form the gate electrode 15. Then, as shown in FIG. 4B, on the silicon substrate 11, an oxide film 31 and a nitride film 32 are successively deposited. The oxide film 31 is preferably formed thin to have a lower energy barrier than the gate oxide film 14. The gate electrode 15 is preferably formed such that the silicide is formed on the polysilicon. Then, an anisotropic etching is preferably performed on the entire surface of the nitride film 32 to form sidewall spacers 32a at both sides of the oxide film 31 surrounding the gate electrode 15. As shown in FIG. 4C, a photoresist 41 is applied on the entire pattern of FIG. 4B. By patterning the photoresist 41 as shown in FIG. 4D, a prescribed upper surface of the oxide film 31 and the drain-side sidewall spacer 32a are exposed. Then, as shown in FIG. 4E, the oxide film 31 is preferably removed by etching.

Figure 4F:
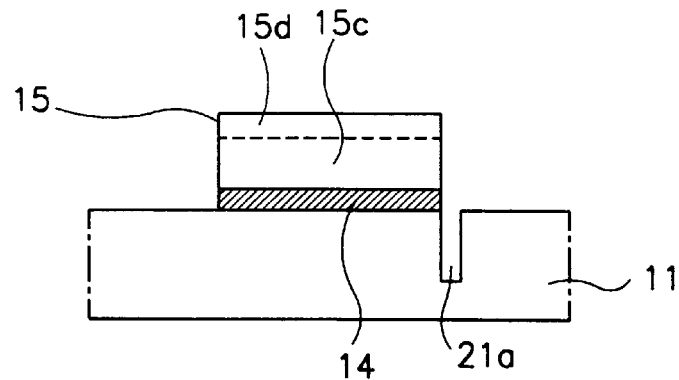

As shown in FIG. 4F, an anisotropic etching is preferably carried out on the semiconductor substrate to form a perpendicular hole 21a to a predetermined depth in the silicon substrate with a width substantially identical to the thickness of the oxide film 31. The gate electrode 15 is composed with the silicide film 15d on the polysilicon 15c. Accordingly, when an anisotropic etching is performed for the formation of the hole 21a, the gate electrode 15 is protected from the etchant by the silicide. Thus, the etching can be carried out without damaging the gate electrode 15. Then, the residual photoresist 41 is preferably removed and the nitride sidewall spacer 32a is selectively etched. The residual oxide film 31 is preferably removed by etching, which results in forming the pattern in FIG. 4F.

Figure 4G:
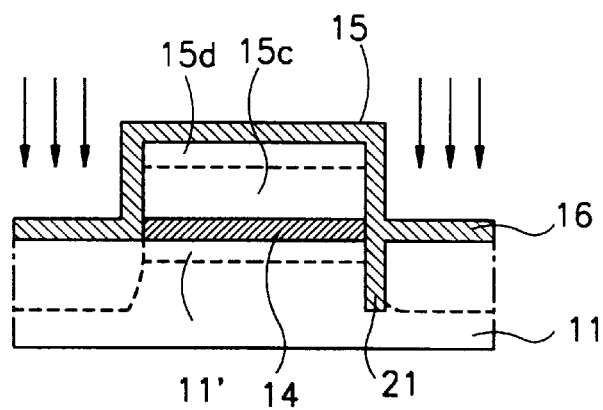
Figure 4H:
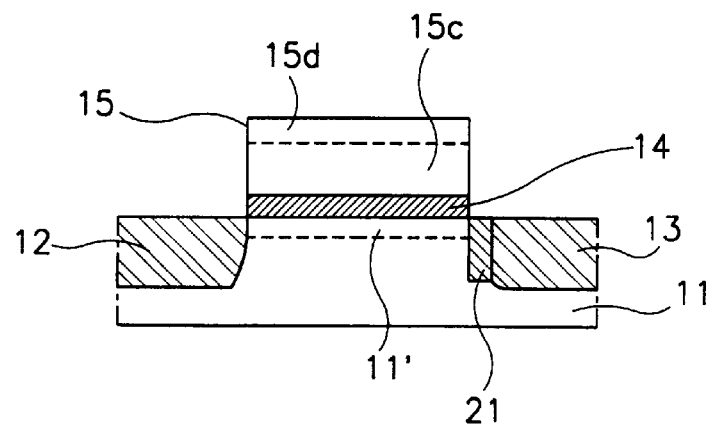

Then, a thermal oxidation is preferably performed on the resultant entire surface of the semiconductor substrate having the gate oxide film 14, the gate electrode 15 and the hole 21a to form the tunnel oxide film 21 in the hole 21a and a buffer oxide film 16, as shown in FIG. 4G. As shown in FIG. 4H, an impurity is implanted into defined portions of the semiconductor substrate 11 at both sides of the gate electrode 15, covered with the buffer oxide film 16 and thermally treated to form the source 12 and the drain 13. Then, when a fixed voltage is applied on the gate electrode 15, the channel 11' is formed between the source 12 and the drain 13. Finally, the buffer oxide film 16 is etched to complete the MOSFET device of FIG. 3.

Figure 5A:
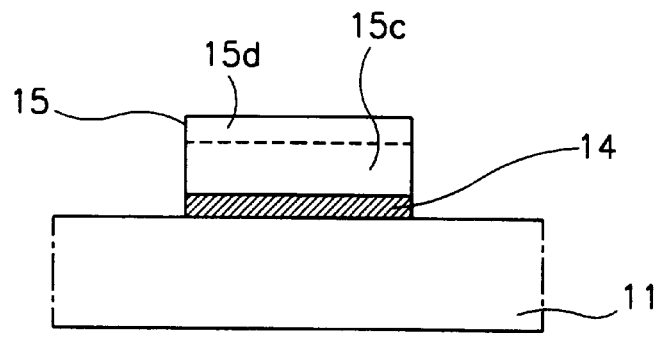
FIGS. 5A–5G are diagrams showing cross-sectional views of another preferred embodiment of a fabrication method of the MOSFET of FIG. 3.
Figure 5B:
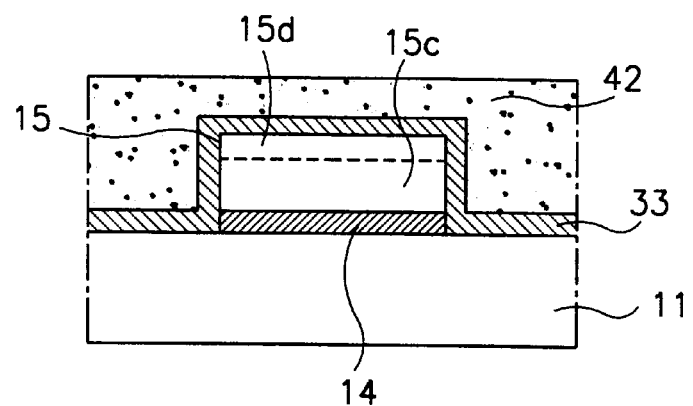
Figure 5C:
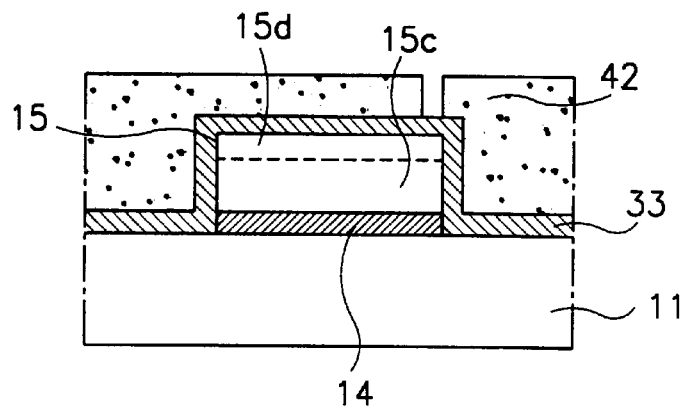
Figure 5D:
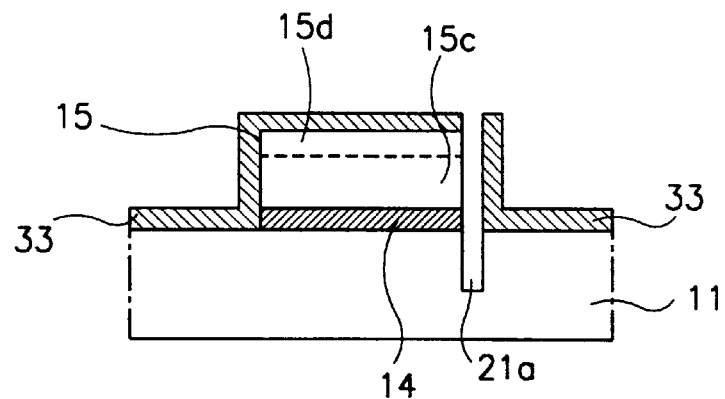
Figure 5E:
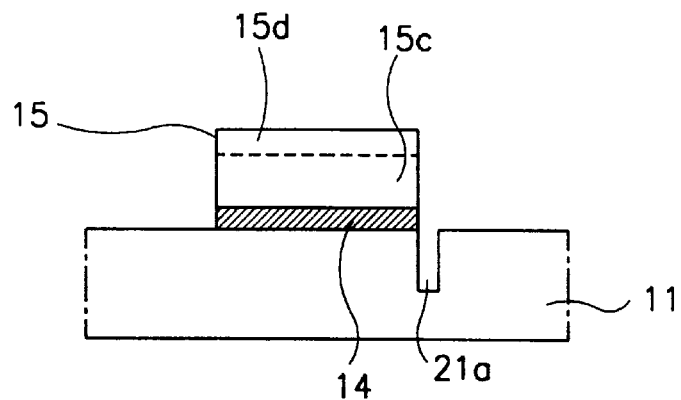
Figure 5F:
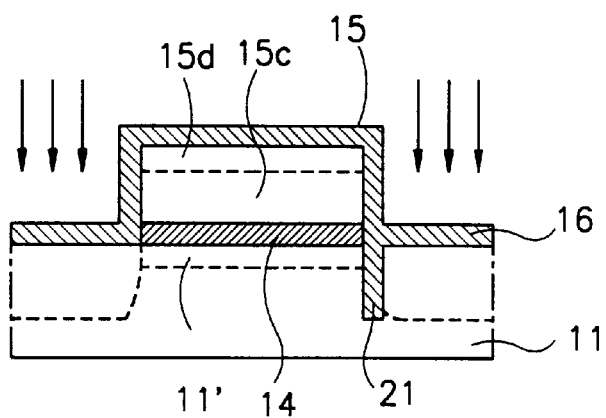
Figure 5G:
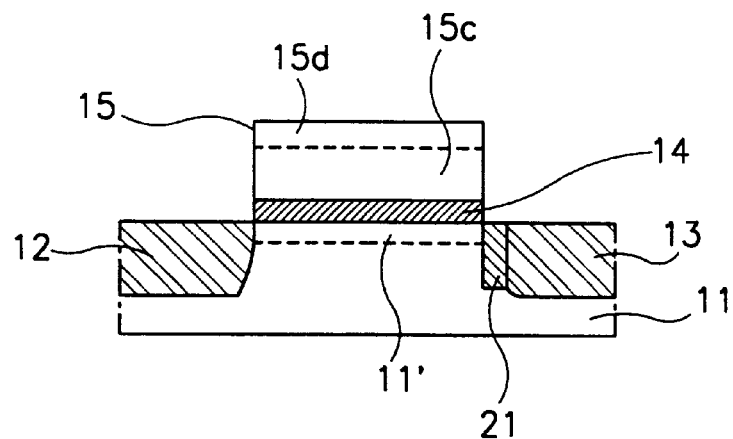

FIGS. 5A through 5G show a second preferred embodiment of a fabrication method of the tunneling insulation film MOSFET of FIG. 3. As shown in FIG. 5A, the gate oxide film 14 is formed on the p-type silicon substrate 11, and the polysilicon layer 15c and the silicide film 15d are formed on the gate oxide film 14. By performing the patterning on the resultant surface, the gate electrode 15 is formed. As shown in FIG. 5B, a nitride film 33 or an oxide film is deposited on the silicon substrate 11, and a photoresist 42 is applied on the nitride film 11. As shown in FIG. 5C, the photoresist film 42 is preferably patterned to expose a portion of the upper surface of the nitride film 33 at one side of the gate electrode 15. As shown in FIG. 5D, an anisotropic etching is preferably performed on the exposed nitride film 33 to etch the silicon substrate 11 down to a predetermined depth. The residual photoresist film 42 and the nitride film 33 on the silicon substrate 11 are preferably successively removed to fabricate the semiconductor substrate 11 having the gate oxide film 14, the gate electrode 15 and the hole 21a formed thereon as shown in FIG. 5E. As shown in FIG. 5F, a thermal oxidation is preferably carried out on the semiconductor substrate 11 to form the tunneling oxide film 21 in the hole 21a and the buffer oxide film 16 on the gate electrode 15 and the semiconductor substrate 11. As shown in FIG. 5G, an impurity is implanted into defined portions of the semiconductor substrate 11 to form the source 12 and the drain 13. Finally, the buffer oxide film 16 is removed to complete the fabrication of the tunneling insulation film MOSFET.

Figure 6:
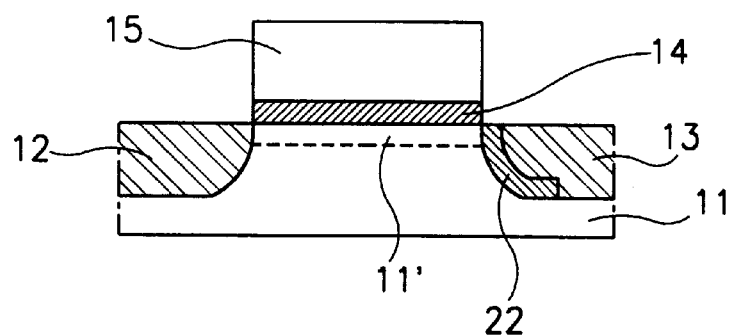
FIG. 6 is a diagram showing a cross-sectional view of another preferred embodiment of a tunneling insulation film MOSFET according to the present invention.

FIG. 6 is a cross-sectional view of a tunneling insulation film MOSFET according to a second preferred embodiment of the present invention. As shown in FIG. 6, the gate oxide film 14 and the gate electrode 15 are sequentially formed on the upper surface of the p-type silicon substrate 11, and the source 12 and the drain 13 are formed by doping an impurity into the silicon substrate 11 at both sides of the gate electrode 15. The tunneling oxide film 22 is formed down to a portion of the bottom surface of the drain region 13, in such a manner that the tunneling oxide film 22 is perpendicular to the channel region 11' and adjacent the drain 13.

A third preferred fabrication method according the present invention of the tunneling insulation film MOSFET of the second preferred embodiment will now be described.

Figure 7A:
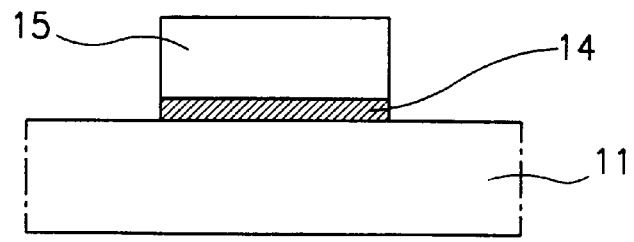
FIGS. 7A–7G are diagrams showing cross-sectional views of a preferred embodiment of a fabrication method of the MOSFET of FIG. 6.
Figure 7B:
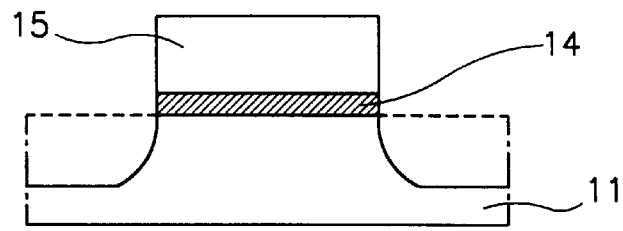
Figure 7C:
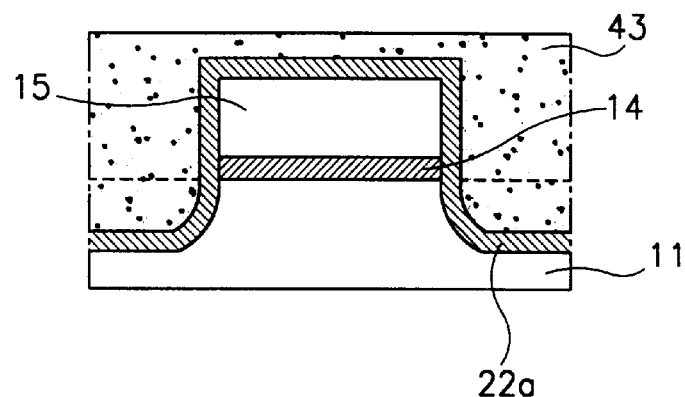
Figure 7D:
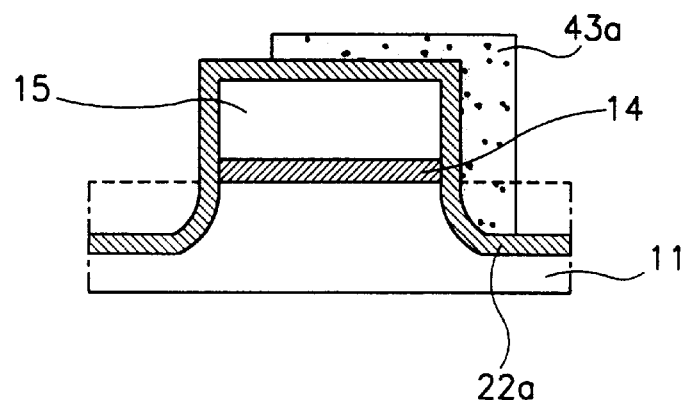
Figure 7E:
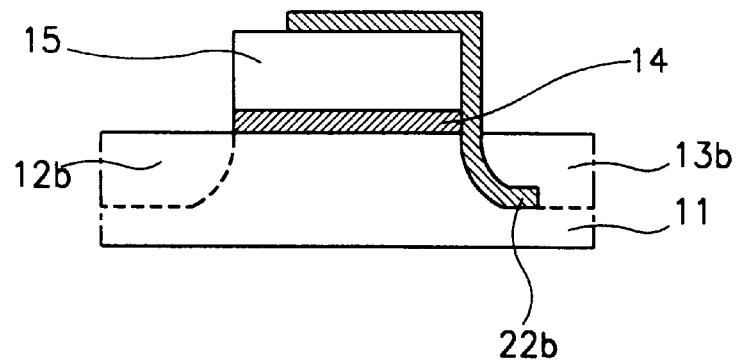
Figure 7F:
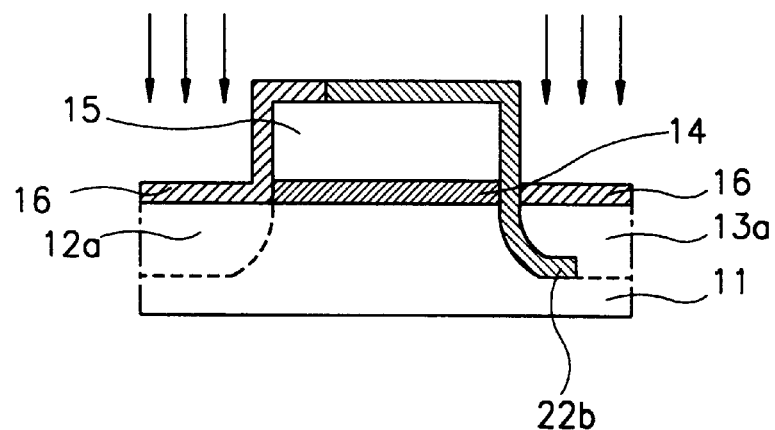
Figure 7G:
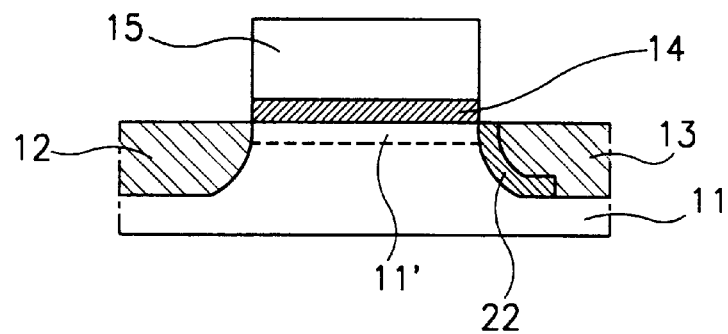

As shown in FIG. 7A, the gate oxide film 14 and the gate electrode 15 are formed on the silicon substrate 11. As shown in FIG. 7B, the silicon substrate at both sides of the gate electrode 15 is etched to a predetermined depth relative to the surface thereof. As shown in FIG. 7C, a thermal oxidation is preferably performed on the entire surface of the silicon substrate 11 including the gate electrode 15 to form an oxide film 22a. A photoresist film 43 is applied on the silicon substrate 11. Then, as shown in FIG. 7D, the photoresist film 43 is preferably selectively removed so that a predetermined width pattern of the photoresist film 43a formed on the gate electrode 15 and the substrate 11 remains. Using the photoresist film 43 shown in FIG. 7D as a mask, the unmasked portion of the oxide film 22a is preferably removed and the residual photoresist 43a is removed. Epitaxial layers 12b, 13b are formed on the etched portions of the silicon substrate 11 at both sides of the gate electrode 15 as shown in FIG. 7E. As shown in FIG. 7F, the second oxide film (the buffer oxide film) 16 is formed on the entire surface of the semiconductor surface. As shown in FIG. 7G., an impurity is implanted into the epitaxial layers 12b, 13b to form the source 12 and the drain 13 to complete the MOSFET fabrication.

The preferred embodiments of tunneling oxide film and method formed along the boundary surface of the drain and the semiconductor substrate can reduce the leakage current caused by a short channel, and prevent a punchthrough phenomenon, which results in the fabrication of the semiconductor memory device having improved reliability.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A MOSFET, comprising:
   a semiconductor substrate;
   a gate insulating film formed on a surface of the semiconductor substrate;
   a gate electrode formed on the gate insulating film;
   a plurality of impurity regions formed in the semiconductor substrate at both sides of the gate electrode;
   a channel region in the semiconductor substrate below the gate electrode; and
   a tunneling insulation film in the semiconductor substrate between the channel region and one of the impurity regions.

2. The MOSFET of claim 1, wherein the tunneling insulation film is substantially perpendicular to the channel region.

3. The MOSFET of claim 1, wherein the tunneling insulation film is formed along an entire interface region between a portion of the semiconductor substrate under the gate electrode and the one of the impurity regions and extends from the top surface of the semiconductor substrate to a bottom surface of the one impurity region.

4. The MOSFET of claim 1, wherein a thickness of the tunneling insulation film is less than a thickness of the gate insulating film.

5. The MOSFET of claim 1, wherein the gate electrode is composed of a silicide formed on a polysilicon.

6. The MOSFET of claim 1, wherein the tunneling insulation film extends to a predetermined depth and is composed of silicon oxide.

7. The MOSFET of claim 1, wherein an energy barrier of the tunneling insulation film is smaller than an energy barrier of the gate insulating film.

8. A fabrication method for a semiconductor device comprising:
   forming a gate electrode over an upper surface of a semiconductor substrate;
   forming a tunneling insulation film in the substrate adjacent a first side of the gate electrode; and
   forming impurity regions in the semiconductor substrate adjacent the tunneling insulation film and an opposite side of the gate electrode, wherein the tunneling insulation film is between one of the impurity regions and a channel region in the semiconductor substrate below the gate electrode.

9. The method of claim 8, wherein the step of forming the gate electrode on the semiconductor substrate comprises:
   forming a gate insulating film over the upper surface;
   forming a polysilicon layer over the gate insulating film; and
   forming a silicide film over the polysilicon layer.

10. The method of claim 8, wherein forming a tunneling insulation film comprises:
    forming a hole substantially perpendicular to the upper surface of the semiconductor substrate at the first side of the gate electrode; and
    forming an oxide film in the hole.

11. The method of claim 10, wherein the step of forming the hole comprises:
    sequentially depositing a first insulating material and a second insulating material on the gate electrode and the semiconductor substrate;
    forming a second insulating material sidewall at the gate electrode by etching the second insulating layer;
    applying a photoresist film;
    exposing a portion of the first insulating material on the gate electrode;
    etching the first insulating material; and
    performing an anisotropic etching on the semiconductor substrate to a predetermined depth using the gate electrode as a mask.

12. The method of claim 11, wherein the first and second insulating material have a high etching selectivity.

13. The method of claim 11, wherein the first insulating material is composed of an oxide and the second insulating material is composed of a nitride.

14. The method of claim 10, wherein the step of forming the hole comprises;
    depositing an insulating material on the semiconductor substrate and the gate electrode;
    coating a photoresist film on the insulating material;
    patterning the photoresist film to expose an upper surface of the insulating material formed on one side of the gate electrode; and
    performing an anisotropic etching on the insulating material and the semiconductor substrate below the insulating material to a predetermined depth using the patterned photoresist film as a mask.

15. The method of claim 14, wherein the insulating material is composed of a nitride.

16. The method of claim 8, wherein forming a tunneling insulation film comprises:
    etching the semiconductor substrate at both sides of the gate electrode down to a predetermined depth;
    forming an oxide film on the entire surface of the semiconductor substrate; and
    removing the oxide film such that the first side and a predetermined upper surface of the gate electrode and a portion of the etched surface of the semiconductor substrate extending from the first side of the gate electrode remain.

17. A fabrication method for a MOSFET, comprising:

forming a gate insulating film and a gate electrode on an upper surface of a semiconductor substrate;

etching the semiconductor substrate at both sides of the gate electrode down to a predetermined depth;

forming an oxide film on the entire surface of the semiconductor substrate;

removing the oxide film such that one side and a predetermined upper surface of the gate electrode and a portion of the etched surface of the semiconductor substrate extending from the one side of the gate electrode remain; and forming a source and drain on the etched areas of the substrate adjacent the other side of the gate electrode and the remaining oxide film, wherein the remaining oxide film is between one of the source and drain and a channel region in the semiconductor substrate under the gate electrode.

18. The method of claim 17, further comprising forming an epitaxial layer on the etched areas on the semiconductor substrate; and forming the source and the drain by implanting an impurity into the epitaxial layer using the gate electrode as a mask.

19. The method of claim 17, wherein the oxide film is formed by a thermal oxidation.

an insulating film formed over the substrate and under the conductive layer; and first and second impurity regions formed in the substrate wherein the first impurity region is adjacent the tunneling insulation film and the second impurity region is adjacent a second side of the conductive layer, wherein the second side is opposite the first side.

20. A semiconductor device, comprising:

a channel region formed in a substrate;

a conductive layer formed over the channel region; and a tunneling insulation film formed in the substrate adjacent to a first side of the channel region; and first and second impurity regions respectively formed in the substrate, wherein the first impurity region is adjacent the tunneling insulation film and the second impurity region is adjacent a second side of the channel region, and wherein the second side is opposite the first side.

21. The semiconductor of claim 20, further comprising:

an insulating film formed over the substrate and under the conductive layer, and wherein the tunneling insulation film is between the first impurity region and the channel region.

22. The semiconductor device of claim 21, wherein the first and second impurity regions are respectively a drain and a source, and wherein when a voltage is applied to the conductive layer, the drain is electrically coupled to the source through the channel region in the substrate that corresponds to the conductive layer.

23. The semiconductor device of claim 21, wherein the tunneling insulation film is substantially perpendicular to the channel region, and wherein an energy barrier of the tunneling insulation film is smaller than an energy barrier of the insulating film.

24. The semiconductor device of claim 20 further comprising an insulating film formed over the substrate and under said conductive layer, wherein said tunneling insulation film has a thickness which is less than said insulating film.

25. The MOSFET of claim 1, wherein a portion of the substrate horizontally between the impurity regions conforms to a shape of the gate electrode.

26. The MOSFET of claim. 1, wherein the channel region is between first and second impurity regions that are respectively a source and a drain, and wherein the tunneling insulation film conforms to the shape of the channel region.

27. The MOSFET of claim 1, wherein first and second impurity regions of the plurality of impurity regions are respectively formed in the substrate at each of both sides of the gate electrode, wherein a first region of the substrate that includes the channel region is between the first and second impurity regions, further comprising:

a first side interface between the first region and the first impurity region; and a second side interface between the first region and the second impurity region, wherein the tunneling insulation film covers one of the first and second side interfaces.

28. The MOSFET of claim 27, wherein the first and second impurity regions are a source and a drain, and wherein the channel is in the first region with one end blocked by the tunneling insulation film.

29. The MOSFET of claim 1, wherein the tunneling insulation film is adjacent both the channel region and said one of the impurity regions.

30. The semiconductor device of claim 21, further comprising:

a first side interface between the channel region and the first impurity region; and a second side interface between the channel region and the second impurity region, wherein the tunneling insulation film insulates the first side interface.

31. A semiconductor integrated circuit device, comprising:

a first conductivity type substrate;

first and second semiconductor regions of a second conductivity type selectively formed in said substrate;

a gate insulating film formed over an upper surface of said substrate between said first and second semiconductor regions;

a gate electrode formed on said gate insulating film;

wherein a portion of said substrate provided below said gate electrode includes a channel of a transistor being formed by said gate electrode and said first and second semiconductor regions when carriers are flowing in the channel from the first semiconductor region to the second semiconductor region; and an insulating layer formed between the channel and at least one of the first and second semiconductor regions.

* * * * *